United States Patent [19]

den Brinker

[11] 4,223,275
[45] Sep. 16, 1980

[54] LINEAR AMPLIFIERS

[75] Inventor: Carl S. den Brinker, Oakley, England

[73] Assignee: Texas Instruments Incorporated, Dallas, Tex.

[21] Appl. No.: 949,313

[22] Filed: Oct. 6, 1978

Related U.S. Application Data

[63] Continuation of Ser. No. 685,590, May 12, 1976, abandoned.

[51] Int. Cl.² .............................................. H03F 3/45
[52] U.S. Cl. .................................. 330/257; 328/127; 330/288
[58] Field of Search ....................... 330/146, 257, 288; 328/127, 128

[56] References Cited

U.S. PATENT DOCUMENTS 4,004,247   1/1977   Van De Plassche ................. 330/257

OTHER PUBLICATIONS

Van De Plassche, "A Wide-Band Operational Amplifier with a New Output Stage and a Simple Frequency Compensation, *IEEE Journal of Solid-State Circuits*, vol. SC-6, No. 6, Dec. 1971, pp. 347–352.

*Primary Examiner*—James B. Mullins
*Attorney, Agent, or Firm*—Melvin Sharp; N. Rhys Merrett; Gary Honeycutt

[57] ABSTRACT

A voltage current transactor including a pair of cross-coupled current generators fed with equal currents from a constant current source. The current generators comprise cascaded bipolar transistor current mirrors in which current magnification is achieved by use of emitter multiplication. The output current is controlled only by the input voltage. Both the input port and output port are isolated in terms of identification (return paths) and while the input port can act on the output port, the reverse is not true. The device functions as a mid-identified current source wherein the current outputs are in anti-phase but independent of each other. The overall transconductance of the circuit can be programmed over a wide range by means of a single external resistor.

Typical applications of the transactor to provide linear amplification, differentiation, integration with integration constant and gyrator functions are described.

30 Claims, 9 Drawing Figures

LINEAR AMPLIFIERS

This is a continuation, of application Ser. No. 685,590, filed May 12, 1976 now abandoned.

This invention relates to an amplifier and in particular to an amplifier having a high impedance input for a voltage signal and a high impedance output for a current signal.

Operational amplifiers, which may be defined as high gain amplifiers with a high impedance input for a voltage signal and a low impedance output for a voltage signal, are widely used in analog signal processing circuits, active filters, integrating and differentiating circuits. In such circuits feedback networks over the amplifier are commonly provided for producing the desired relationship between an input signal and an output signal. However, because of the voltage to voltage nature of the amplifier considerable care must be taken to ensure that the feedback does not upset the inherent input common mode rejection of the amplifier, especially where differing common mode levels exist at the input and the output of the amplifier. Such problems are likely to be encountered in instrumentation circuits.

The low impedance output of an operational amplifier can be detrimental when the amplifier is used in an active filter. It can be shown that it is preferable to use an amplifier having an input and an output both of high impedance in certain kinds of active filters, and if an operational amplifier is used in such an application the circuit can become excessively complicated and the gain obtained from the amplifier drastically restricted.

It is an object of the present invention to provide an improved amplifier having a high impedance input for a voltage signal and a high impedance output for a current signal. Such a device is sometimes referred to as a voltage current transactor.

According to the present invention there is provided an amplifier having first and second input terminals for receiving first and second input voltages respectively, first and second output terminals for conveying first and second output currents respectively, first and second current generators respectively coupled to the first and second input terminals and having respective current flow conductors to which equal currents are applied by the generators and on which voltages proportional to the first and second input voltages respectively are established in operation of the amplifier, terminals for resistive means to interconnect the current flow conductors of the current generators, thereby to cause cross-current to flow between said current flow conductors, said cross-current having a magnitude and sense directly related to the difference between said first and second input voltages and inversely proportional to the resistance of said resistive means; and individual current mirror amplifier means coupled between said current flow conductors and said first and second output terminals respectively for producing amplifier output currents having magnitudes corresponding to those of the currents through said current flow conductors modified in respective opposite senses according to the magnitude and sense of said cross-current produced by said first and second input voltages.

Preferably the current generators each include a plurality of current mirror amplifier of alternating conductivity types connected in cascade. A further Wilson source having two outputs respectively connected to the first and second current generators may be provided to ensure that the current generators receive equal currents both determined by a bias resistor. The value of the bias resistor should be selected such that the currents tending to flow in the current flow conductors of the current generators exceed the maximum current likely to occur in the resistive means interconnecting the current flow conductors of the generators. The current mirror amplifiers in the first and second current generators may be interconnected in such a way as to ensure a closer equality of the two current outputs. The voltages established on the current flow conductors of the current generators may be equal to the first and second input voltages respectively, that is to say the signal paths coupling the input terminals to the current flow conductors in the current generators have unity voltage gain.

The current flow conductors of the current generators may be cross-connected via current flow amplifiers so that both output terminals are connected to the current outputs of both current generators but with an inversion of signs as a result of the cross-connections.

An amplifier in accordance with the invention may be constructed in integrated circuit form with terminals provided for the connection of the resistive means interconnecting the current flow conductors of the current generators, in order to program the transconductance of the amplifier, and, for connection of bias resistor for determining the current feeds to the current generators, to facilitate programming the amplifier to particular systems design applications.

In order that the invention may be fully understood and readily carried into effect, embodiments thereof will now be described by way of example, with reference to the accompanying drawings, of which:

Figure 1:
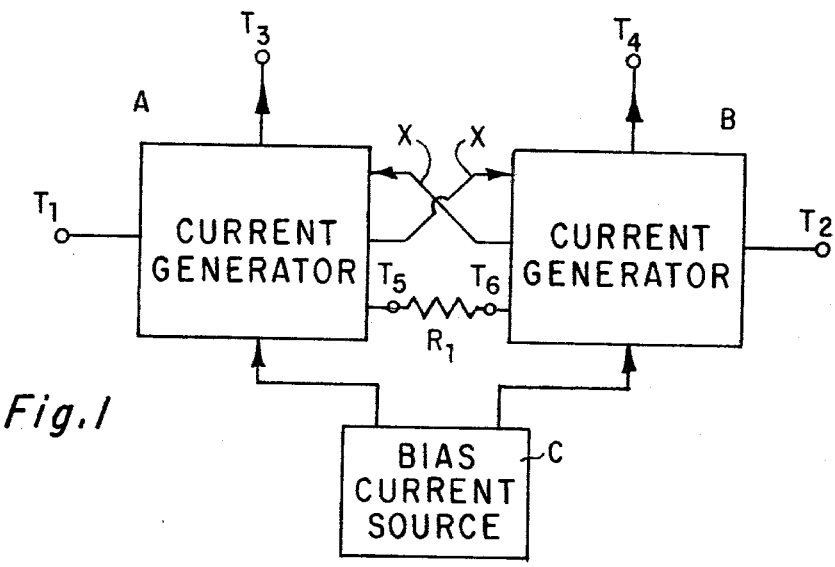
FIG. 1 is a block diagram illustrating the principle of an amplifier in accordance with the invention.

FIG. 1 shows two current generators A and B to which equal feed currents are applied from a common bias current source C. Input terminals T1 and T2 are connected respectively to the generators A and B for applying to those generators first and second input voltages respectively. Output currents from the generators A and B appear at terminals T3 and T4 respectively and voltages proportional to the first and second input voltages applied to terminals T1 and T2 appear at terminals T5 and T6 respectively, which terminals are connected to respective current path nodes in the generators A and B. A resistor R1 is connected between the terminals T5 and T6. Cross-connections X are provided for feeding the current output of each generator to the other.

In order to understand the operation of the circuit shown in FIG. 1 consideration will now be given to the operation of the generator A. A constant current is applied to the generator A from the source C and a fixed proportion of this current flows along a current flow path including current mirror amplifiers forming part of the current generator A and which couple the input terminal T1 to the terminal T5, which is connected to a low impedance node of the current flow-path, and a voltage proportional to the first input voltage applied to the terminal T1 appears at the terminal T5. A similar circuit arrangement exists in the generator B, with the result that a potential difference proportional to the difference between the first and second input voltages is applied across the resistor R1, thereby causing a current to flow in the resistor R1 which is proportional to the difference between the first and second input voltages, inversely proportional to the resistance of the resistor R1, and has a sense determined by the relative magnitudes of those input voltages. As a result of the current through the resistor R1 the currents flowing out of the current flow paths in the generators A and B differ by an amount proportional to the difference between the first and second input voltages. In a simple amplifier according to the invention, current mirrors are used to couple these differing currents from the low impedance nodes T5 and T6 to the terminals T3 and T4 respectively. It will be apparent therefore that the current outputs of the generators A and B are proportional to the difference between the first and second input voltages, subject to a fixed offset. If the first and second input voltages are in fact supplied from the two terminals of a balanced (differential) input signal and the resultant output currents at the terminals T3 and T4 are used to provide a balanced output current from the amplifier, it will be evident that the transconductance of the amplifier, which is equal to the quotient of the difference between the output currents divided by the difference of the input voltages, is inversely proportional to the resistance of the resistor R1.

The gain of the amplifier can be improved by the provision of the cross-connections X, each of which serves to invert the current output from the low impedance node of one generator and add it to the current output from the low impedance node of the other so that the difference between those output currents appears at each of the terminals T3 and T4 but with opposite polarity, and the contribution of the bias current from the source C is virtually eliminated.

Figure 2:
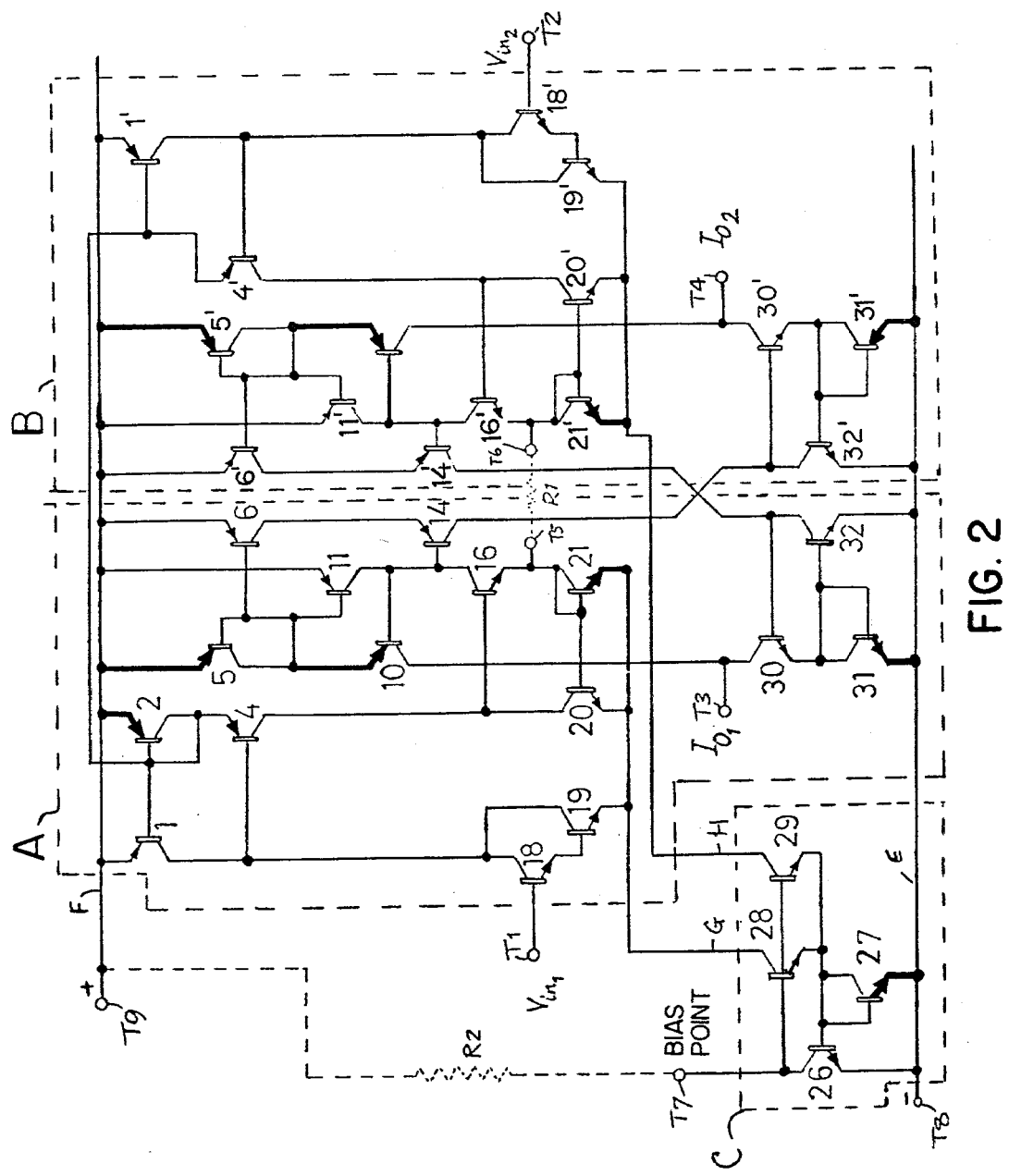
FIG. 2 is a circuit diagram of one embodiment of the invention.

FIG. 2 shows the circuit diagram of an amplifier according to an example of the invention which operates as described above with reference to FIG. 1 and is suitable for construction in integrated circuit form. In FIG. 2 the circuits of the current generators A and B are indicated in dashed outline. The same reference numerals are used to identify like circuit elements in both generators, except that those used in connection with B generator are primed. The generator A includes NPN transistors 18 and 19 connected as a Darlington pair amplifier with the base of the transistor 18 connected to the terminal T1. The Darlington circuit is used to increase the overall d.c. gain and to increase the small signal input resistance. The emitter of the transistor T19 receives current from a conductor G. The common collector of transistors T18 and T19 is connected to the collector of a PNP transistor 1 and to the base of a PNP transistor 4, the emitter of which is connected in common to the collector and base of a PNP transistor 2, and to the base of the transistor 1. The emitters of transistors 1 and 2 are connected to a positive supply conductor F connected to a terminal T9. A connection is provided from the bases of the transistors 1 and 2 to the base of a transistor 11 in the current generator B; the purpose of this cross-connection will be described in detail later.

The transistors 1,2 and 4 form a type of linear inverting current amplifier known as a Wilson current mirror amplifier (as described on pages 343 and 344 of the I.E.E.E. Journal of Solid State Circuits, Vol. SC-3 No. 4, Dec. 1968) which operates in such a way that the current fed to the collector of the transistor 1 by the transistors 18 and 19 is reproduced at the collector of the transistor 4, but in the present instance subject to an increase by a predetermined constant factor because the area of the emitter base junction of the transistor 2 is made larger than the area of the emitter base junction of the transistor 1, this larger area being indicated by the thickened emitter connection of the transistor 2. The collector of the transistor 4 is connected to apply an input current to another Wilson current mirror formed by the npn transistors 16, 20 and 21. Again this current source produces a fixed current gain by virtue of the fact that the emitter base junction area of the transistor 21 is larger by a predetermined amount than that of the transistor 20. Both transistors 20 and 21 have their emitters connected to the current feed conductor G. The terminal T5 is connected to the collector and base of the transistor 21, and the transistors 18, 19, 1, 2,4, 20, 21 and 16 operate together so that an input voltage change applied to the terminal T1 produces an equal voltage change at the terminal T5. The output current from the collector of the transistor 16, being the output current of the Wilson current mirror 16, 20, 21, is applied to a combination of five PNP transistors 5, 6, 10, 11 and 14, which together form a dual Wilson current mirror, one mirror being formed by the transistors 5, 10 and 11 and producing an output current from the collector of the transistor 10, and the other mirror being formed by the transistors 5, 6, 11 and 14. This last mentioned Wilson source is complicated by the addition of the transistor 6 which is used to generate the current applied to the emitter of the transistor 14 instead of the transistor 5, the transistor 5 already being used to feed current into the emitter of the transistor 10. Again, because the emitter base junction areas of the transistors 5 and 10 are larger by a predetermined amount than the emitter base junction areas of the transistors 6 and 11, the current output from the collector of the transistor 10 is subject to gain determined by the ratio of the areas. However, no such factor influences the current output of the transistor 14 which is therefore equal to the collector current of the transistor 16.

A further Wilson current mirror is formed by NPN transistors 30, 31 and 32 which receives as input the current output from the PNP transistor 14' of the other current generator B. Again because the emitter base area of the transistor 31 is larger by a predetermined amount than the emitter base area of the transistor 32 the Wilson source formed by transistors 30, 31 and 32 has a current gain determined by the ratio of the areas. The collectors of the transistors 30 and 10 are joined to a current output terminal T3. It will be apparent that the current from the collector of the transistor 10 is a positive one whereas that from the collector of the transistor 30 is a negative one, because the emitters of the transistors 31 and 32 are connected to a conductor E which is the negative supply conductor. As these opposite sense currents are added together, the current output at the terminal T3 is equal to the difference between them.

In operation of the circuit shown in FIG. 2, the input current on conductor G is fed into the current mirror 1, 2, 4 and that of conductor H is fed into the current mirror 1', 2, 4'. By emitter multiplication due to the transistor 2, the collector currents of transistors 20 and 20' are multiplied, for example by a factor 2. Again by emitter multiplication, due to transistors 21 and 21', the collector currents of those transistors also are multiplied, for example again by a factor of 2. At the terminals T5 and T6, between which the external transconductance control resistor R1 is connected, voltages are set up corresponding to the voltages applied at input terminals T1 and T2 respectively. The nodes T5 and T6 are high conductance nodes permitting current addition or subtraction dependent on the sense of a differential voltage between the nodes T5 and T6. Thus a differential voltage between those nodes will cause an increase in collector current of transistor 16 and a corresponding decrease in collector current of transistor 16', or vice versa. The collector currents of transistors 16 and 16' are directed to the double current mirrors 5, 10, 11; 5, 6, 11, 14 and 5', 10', 11'; 5', 6', 11', 14' respectively where again emitter multiplication occurs due to the transistors 5, 10 and 5', 10'. The mirrors 5, 10, 11 and 5', 10', 11' feed currents directly in one sense to the output terminals I3 and I4, respectively, while by cross-connection the mirrors 5, 6, 11, 14 and 5', 6', 11', 14' feed the same currents to the NPN current mirrors 30', 31', 32' and 30, 31, 32 respectively, the reflected currents appearing at the terminals T3 and T4 in an opposite sense. It will be apparent that current contributions at the terminals T3 and T4 from the bias point at the terminal T7 are cancelled out by the current inversion and summation process.

Appropriate values for the current multiplication factors of the current mirrors, as described above, may be obtained by proper selection of the emitter-base junction areas of the transistors 2, 5, 5', 10, 10', 21, 21', 27, 31, 31' and/or use of emitter resistors in the current mirror circuits. The use of emitter area multiplication improves the gain-bandwidth product of the amplifier and also ensures that power dissipation in the circuit itself is minimized. However, in some circumstances it may be desired to utilize multiplication factors less than unity and this may readily be accomplished in similar manner.

It will be appreciated that the bias current Ip supplied to the terminal T7 is determined by the external resistor R2 which, by appropriate selection, provides a means of programming whereby a systems designer can tailor the performance of the circuit to particular applications. The value of Ip is non-critical in most applications except where maximum band width is desired or where it affects the signal swing.

It will be apparent from the consideration of the above explanation that it is desirable that the currents flowing in the generators A and B should be equal, and it is for this purpose that the base of the transistor 2 in generator A is connected to the base of the transistor 1' in generator B. The transistor 2 is common to the Wilson current mirror 1, 2, 4 of generator A and current mirror 1', 2, 4' of generator B, and the common transistor 2 providing the currents fed into the emitters of the transistors 4 and 4', serves to ensure an equality of current gain in the two Wilson sources 1, 2, 4 and 1', 2, 4, consequently assisting in balancing the currents in the two generators.

It will also be apparent that in order for the circuit described above to operate satisfactorily the currents applied along the conductors G and H should be larger than any current likely to be required to flow along the resistor R1, and therefore it is desirable that the resistor R2 be chosen with this criterion in mind.

The circuit arrangement of FIG. 2 is particularly suited to manufacture an integrated circuit form, because it can be formed entirely of transistors with terminals T5, T6, T7 and T9 for connection of external resistors R1 and R2.

The circuit described above with reference to FIGS. 1 and 2 is a voltage to current transactor amplifier wherein the output current is controlled by the input voltage in terms of magnitude and polarity. It will be noted that the input port and output port are isolated in terms of identification so that either output terminal may be used as a reference point and that while the input port can act on the output port, the reverse is not true. The transactor is characterized by very high impedance input and output ports. The actual load potential can vary between nearly $+V_{ss}$ and $-V_{ss}$ while the output potential is not restricted by a possible common mode potential. Furthermore, an accurately linear input-output relation can be obtained over a wide range of signals and a high level of rejection of power supply, temperature and common-mode (input and output) variations is possible. By means of the external resistor R1, the transactor can be programmed for a desired value of transconductance which may be varied over a wide range.

Further advantages are the freedom of application over the full input and output dynamic ranges and a high degree of linearity characteristic of operational amplifiers. The amplifier can be used in a common mode output configuration or a balanced configuration, i.e. mid-identified output, in which case the output currents are in antiphase but independent of each other. True unilaterality is achieved since the amplifier gain is not determined by external feedback loops and there is common mode independence between the amplifier input and output.

Figure 3:
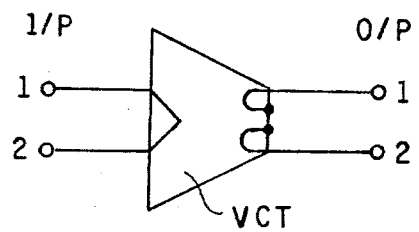
FIG. 3 is a symbolic depiction of a voltage current transactor (VCT) embodying the invention.

The voltage to current transactor described with reference to FIGS. 1 and 2 is shown symbolically in FIG. 3. Output OP1 is the non-invertive output for input IP1 and the output OP2 has the same relationship with respect to input IP2. The presence of an intrinsic ground terminal does not detract from the validity of using the VCT in a balanced output configuration, i.e. into a mid-identified output. The VCT also may be used in a common mode output configuration. Examples of practical application of VCT's embodying the invention are briefly described below in reference to FIGS. 4–8.

Amplification

Figure 4A:
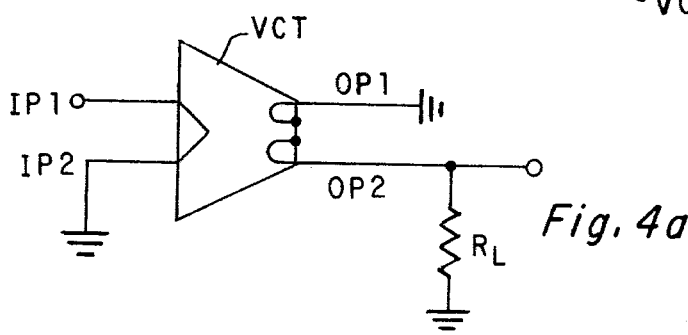
FIGS. 4a and 4b are schematic illustrations of amplifiers incorporating a VCT embodying the invention.

The VCT amplifier allows several new approaches to be made in terms of amplification. Besides the more obvious opportunities such as the use of a balanced output which, in an electromagnetically hostile environment, has a considerable advantage over the unbalanced configuration, other more fundamental differences can be shown to exist. One of these differences is illustrated in FIG. 4. In FIG. 4a, a simple inverting amplifier stage is shown where the voltage gain $A_{vs}$ is determined by the simple relationship.

$$A_{vs} = V_{in}/V_{out} = 1/G \cdot R_L$$

where G=VCT transconductance and $R_L$= load impedance.

Figure 4B:
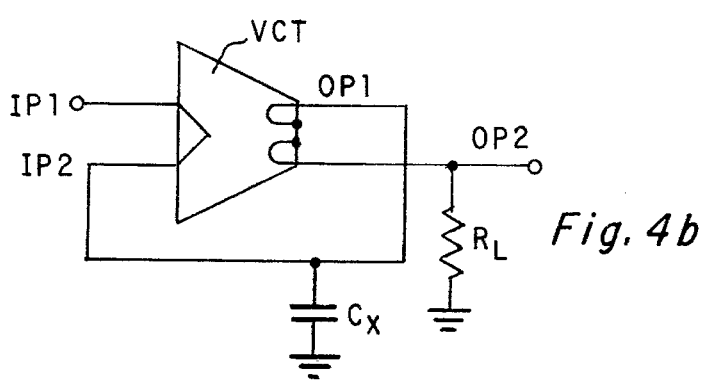

This expression describes the behavior of a base band configuration. At times however, it is desirable to use a band pass or a.c. coupled amplifier. This is implemented as shown in FIG. 4b where the high input impedance of the amplifier is maintained. This contrasts with the conventional solution wherein a series capacitor and parallel d.c. restoring resistor are connected to the input of a voltage amplifier, and the d.c. restoring resistor is significantly smaller than the input impedance of the amplifier, this in turn determining the a.c. coupling capacitor.

Arithmetic Applications

Figure 5:
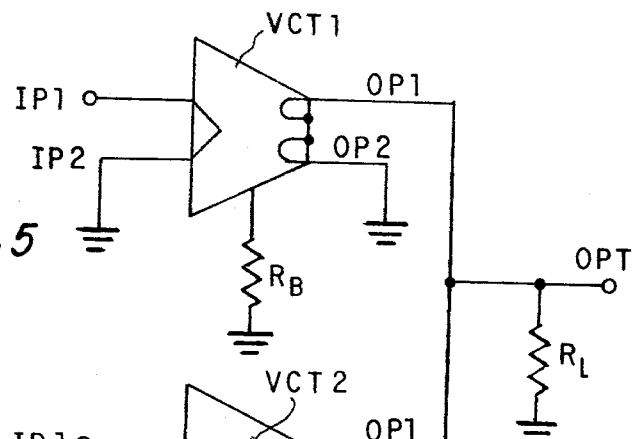
FIG. 5 is a schematic representation of an algebraic addition circuit incorporating VCTs embodying the invention.

Besides direct amplification, arithmetic functions such as addition and subtraction are again easily implemented by virtue of the current output nature of the VCT. This is particularly relevant in the case of the addition of small amplitude or differing amplitude signals. The VCT amplifier can be made to provide the appropriate amplification without the need arising to attenuate the derived signals at the summing point, as is common in operational amplifier configurations. Besides the reduction in circuit complexity, a major advantage of this approach is the reduction in the noise figure of the arithmetic system. The VCT approach avoids amplification followed by attenuation and probably followed again by amplification, in situations where small signals prevail. Furthermore, the internal resistance ($V_{in}/I_{in}$ characteristic) of the VCT is linear and passes through the origin. A typical situation is illustrated in FIG. 5 wherein two amplifiers VCT1 and VCT 2 are used, the output OP1 of amplifier VCT1 and output OP1 of amplifier VCT2 being connected to the common output terminal OPT. Input signals, e.g. sine waves and/or square waves, are applied to the input terminals IP1 of the amplifiers VCT1 and VCT2 respectively, the bias resistors $R_b$ corresponding in function to resistor R2 in FIG. 2.

Differentiation

The transconductance nature of the VCT amplifier coupled with a high slew rate makes it particularly suitable to high gain differentiation configurations. This is one application where the operational amplifier is at a disadvantage, particularly since the operational amplifier must fundamentally be either of the voltage to voltage or current to current type if it is required to maintain commonality between the input and output ports. This is required to achieve simple feedback configurations. Such an amplifier will therefore have an output port, which tends to follow the input signal irrespective of the output termination. Consequently, this tends to preclude the interaction of an independent variable acting on a coefficient in order to obtain the dependent variable. Dissimilarity of input and output port signals tends to be most pronounced in differentiation.

Figure 6:
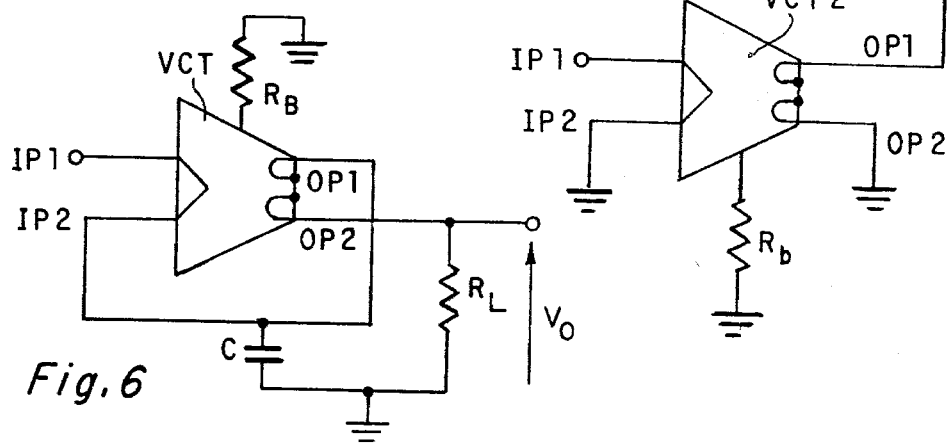
FIGS. 6 and 7 are schematic illustrations of differentiation and integration circuits each incorporating a VCT embodying the invention.

A typical differentiation circuit is shown in FIG. 6 in which the input signal is applied to input terminal IP1; while input terminal IP2 is connected to the output terminal OP1. The output signal is obtained from output terminal OP2. Resistor $R_L$ is connected between OP2 and ground and feedback capacitor C is connected between OP1 and ground.

In FIG. 6 the output peak voltage $V_o$ is equal to the input peak voltage $E_i$ (applied to terminal IP1) multiplied by the VCT gain. The decaying time constant is determined by the VCT transconductance ($G_m$), the capacitor C and the load resistance $R_L$.

Integration

Figure 7:
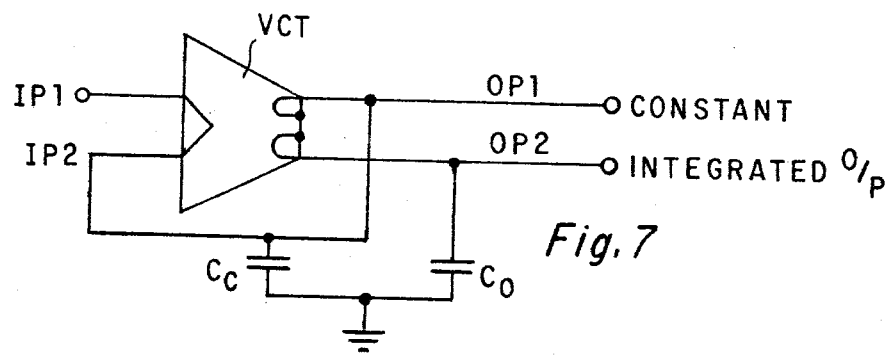

Electronic integration to the purist is not achieved unless the system is capable of resolving the potential constant of integration. The use of the VCT amplifier in an integration configuration delivers both the input waveform integrated over one period as well as the constant. A suitable circuit is shown in FIG. 7. The input signal is applied to input terminal IP1 while input terminal IP2 is connected to output terminal OP1 at which the integration constant level appears. The integrated output signal appears at output OP2. Capacitors $C_c$ and $C_o$ ($C_c$>>$C_o$) are connected between IP2 and OP2, respectively, and ground.

The derivation of the constant is particularly useful in such applications as frequency sensitive systems, where the input signal drives a one shot multivibrator. A varying frequency coupled with a constant pulse width derived from the one shot device will result in a d.c. signal occurring at the "constant" terminal of an integration circuit. By judicious choice of external components the integration circuit can thus provide a d.c. level which is a function of the input frequency.

Gyration

Gyration as defined by Tellegen, "The Gyrator, a New Electric Network Element" Philips. Res. Reps., Vol. 3, pp. 81–101, April 1948, provides a powerful method of dealing with circuit problems that could otherwise become impractical.

Tellegen's definition of the operation of this element was that it gyrates a voltage into a current and vice versa.

In realization of a practical gyrator two transconductances and means for phase inversion are required. Hence practical gyrators, using single active devices tend to evolve as three stage configurations, two stages to provide the appropriate transconductances while the third stage provides the phase inversion. When elements having differential inputs or outputs are used, such as the transactor or the operational amplifier, only two such elements are needed, as phase inversion can then be implemented by cross connection of either the input or output terminal pairs.

Figure 8:
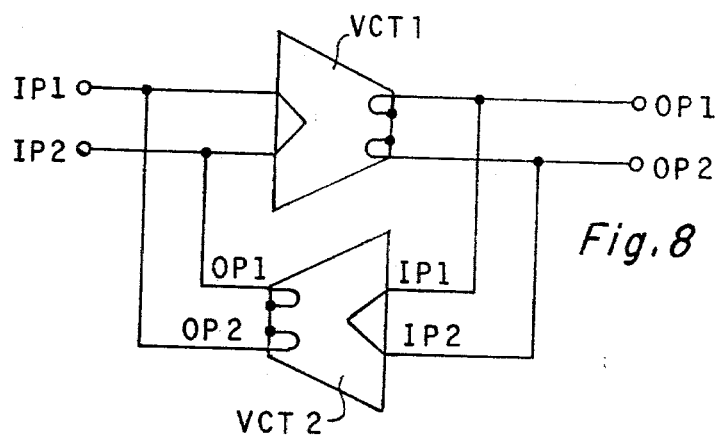
FIG. 8 is a schematic representation of a gyrator incorporating VCTs embodying the invention.

FIG. 8 shows a gyrator constructed using two VCTs, VCT1 and VCT2, the output OP1, OP2 of transactor VCT1 being connected to the corresponding inputs IP1 and IP2 of the transactor VCT2 while the outputs OP1 and OP2 of VCT2 are connected to inputs IP2 and IP1 of VCT1. This gyrator provides a true low pass function down to d.c. and may readily be constructed as a single integrated circuit requiring only three external components, namely a transconductive resistor R1 for each transactor and a bias resistor R2 common to both transactors.

Although a specific embodiment of the invention has been described with reference to FIG. 2, it will be appreciated that it is not necessarily limited to this embodiment and other arrangements using the invention could easily be produced. For example, instead of Wilson current mirrors other forms of current generator could be used provided that particular requirements for voltages and currents in the circuit are met. Moreover, the Darlington pairs providing the initial input amplification could be replaced by other and possibly more complex amplifiers.

What is claimed is:

1. An amplifier having first and second input terminals for receiving first and second input voltages respectively;
   first and second output terminals for delivering first and second output currents respectively;
   means for delivering to first and second current summing nodes equal constant currents, the delivering means also being responsive to the first and second input voltages to produce on the first and second current summing nodes voltages which are the same linear function of the respective input voltages;
   resistive means connected between the first and second current summing nodes so as to pass a cross current, which is proportional to the difference between the voltages on the first and second current summing nodes and inversely proportional to the resistance of the resistive means;
   means coupled to the first and second current summing nodes for producing first and second intermediate currents, each intermediate current proportional to the constant current additively modified in opposite sense to the other by the current in the resistive means;
   means for producing the first and second output currents, which are equally proportional but in opposite senses to the difference between the input voltages, by additively combining at each of the first and second output terminals the first and second intermediate currents to cancel out at each output terminal components of the intermediate currents which are due to said constant currents.

2. An amplifier according to claim 1, including for each current summing node first linear current amplifier means connected between that node and a particular one of the output terminals for response to the particular one of the intermediate currents to deliver a current to the particular output terminal; and second linear current amplifier means connected between the other current summing node and the particular output terminal for response to the other of the intermediate currents to conduct current away from the particular terminal.

3. An amplifier according to claim 2, in which the first linear current amplifier comprises a current mirror using transistors of the same polarity, and in which the second linear current amplifier consists of two current mirrors each using transistors of the same polarity but the transistors of one current mirror being of opposite polarity from the transistors of other current mirror of the second linear current amplifier.

4. An amplifier according to claim 3, in which the first and second linear current amplifiers each have a current magnification which is greater than unity.

5. An amplifier according to claim 4 wherein the current magnification is two times.

6. A circuit according to claim 3, wherein said current mirror amplifiers comprise circuit elements of a single integrated circuit and said resistive means is external of said integrated circuit.

7. An amplifier according to claim 1, including an emitter follower stage connected between each input terminal and its respective current summing node.

8. An amplifier circuit having first and second input terminals for receiving first and second input voltages respectively;
   first and second output terminals for delivering first and second output currents respectively;
   means for delivering to first and second current summing nodes equal constant currents, the magnitude of said constant current being controlled by a first resistive means, the delivering means also being responsive to the first and second input voltages to produce on the first and second current summing nodes voltages which are the same linear function of the respective input voltages;
   a second resistive means connected between the first and second current summing nodes so as to pass a cross current, which is proportional to the difference between the voltages on the first and second current summing nodes and inversely proportional to the resistance of the resistance means;
   means coupled to the first and second current summing nodes for producing first and second intermediate currents, each intermediate current proportional to the constant current additively modified in an opposite sense to the other by the current in the resistive means;
   means for producing the first and second output currents which are equally, but in opposite senses, proportional to the difference between the input voltages, by additively combining at each of the said first and second output terminals the first and second intermediate currents in such a way as to cancel at each output terminal the components of the intermediate currents which are due to the constant current.

9. A circuit according to claim 8, wherein said second input terminal and said first output terminal are both connected to a common reference potential and a load impedance is connected to said second output terminal to provide a linear amplifier circuit.

10. A circuit according to claim 8, including capacitor means coupling said second input terminal and said first output terminal to a reference potential, and further resistive means coupling said second output terminal to said reference potential, to provide a differentiating circuit.

11. A circuit according to claim 8, including first capacitor means coupling said second input terminal and said first output terminal to a reference potential, and second capacitor means coupling said second output terminal to said reference potential; the capacity of said first capacitor means being greater than the capacity of said second capacitor means, thereby to provide an integration circuit for generating an integration output signal at said second output terminal and a signal representing an integration constant at said first output terminal.

12. A signal translating circuit having first and second input terminals for receiving first and second input voltages; first and second output terminals for delivering first and second output currents;
   current generator means for supplying two separate and equal currents;
   first and second current replication paths each having an input end connected to receive a respective one of the currents from the current generator means and each having an output end connected to the first and second output terminals respectively for producing current flows thereat in a first sense;
   the replication paths each including an individual current summing node to which equal currents are delivered from said current generator means in the absence of input signals at said input terminals;

resistor means connecting said current summing nodes;

first and second transistor amplifier means so coupling said first and second input terminals to said first and second current replication paths respectively as to translate said first and second input voltages to corresponding voltages at the current summing nodes of the first and second current replication paths thus causing current flow through said resistor means with a magnitude and sense directly proportional to the difference between said input voltages such that current flows from the current replication paths to said output terminals are modified by an increase in one path and a decrease in the other path corresponding to the current flow through said resistor means;

third and fourth current replication paths having outputs respectively connected to said first and second output terminals for producing current flows thereat in a second sense opposite from said first sense;

respective means connected to couple said modified currents of said first and second current replication paths to inputs of said fourth and third said replication paths respectively;

and wherein each of said current replication paths has an identical current multiplication factor.

13. An amplifier according to claim 12, wherein said current generator means comprises current mirror amplifier means having two current outputs and second resistive means for applying an input current to said current mirror amplifier means for determining the magnitudes of said two equal currents.

14. An amplifier according to claim 13, wherein each of said current replication paths includes a plurality of series connected current mirror amplifier means.

15. An amplifier according to claim 14, wherein each of the first and second current replication paths includes input amplifier means connected to receive a respective one of the input voltages from one of said input terminals, and in each current replication path means connecting the output of said input amplifier to the input of one of said series connected current mirror amplifier means.

16. A linear electric circuit for providing output currents at first and second output terminals controlled by the magnitudes of input voltages at said first and second input terminals; including first and second current replication paths connected between individual constant current source means and said first and second output terminals, respectively, said constant current source means supplying equal input currents to said first and second current replication paths; said first and second current replications paths each including a first current mirror amplifier connected to receive input current from the constant current source for that path; resistive means coupling respective terminals of the first current mirror amplifiers of the first and second current replication paths; circuit means for coupling the input voltages at said first and second input terminals to said terminals of the first current mirror amplifiers coupled by said resistive means, thereby to cause current flow through said resistive means of a magnitude and in a sense determined by the relative magnitudes of said first and second input voltages to correspondingly increase current output from the first current mirror amplifier of one of said first and second current replication paths and to correspondingly decrease the current output from the first current mirror amplifier of the other one of said first and second current replication paths, second current mirror amplifiers of said first and second current replications paths coupling the current outputs of the first current mirror amplifiers thereof to the first and second output terminals respectively to generate replicas of said current outputs in one sense at said output terminals; said current mirror amplifiers of said first and second current replication paths further coupling the current outputs of the first current mirror amplifiers thereof to inputs of third current mirror amplifiers of the respective paths, said third current mirror amplifiers having outputs coupled to the second and first output terminals respectively for producing thereat replicas of said current outputs in a sense opposite from said one sense; and wherein said second and third current mirror amplifiers have identical current gains.

17. A circuit according to claim 16, wherein said first and third current mirror amplifier comprise bipolar transistors of one conductivity type and said second current mirror amplifier comprise bipolar transistors of an opposite conductivity type.

18. A circuit according to claim 17, wherein the first and second current replication paths include respective Darlington input amplifiers comprising bipolar transistors of said one conductivity type, and means coupling said first and second input terminals to said input amplifiers.

19. A circuit according to claim 16, wherein said constant current source means comprises a current mirror amplifier.

20. A circuit according to claim 16, wherein each of said current mirror amplifiers provides current gain greater than unity.

21. A circuit according to claim 16, wherein each of the current replication paths includes a further current mirror amplifier connected to receive one of said input currents and to apply a replica of said input current to the first current mirror amplifier of that current replication path.

22. A circuit according to claim 21, wherein said first and third current mirror amplifiers comprise bipolar transistors of one conductivity type and said second and further current mirror amplifier comprise bipolar transistors of an opposite conductivity type.

23. A circuit according to claim 22, wherein said constant current source means comprises a current mirror amplifier comprising bipolar transistors of said one conductivity type.

24. A circuit according to claim 23, wherein each of said current mirror amplifiers includes a transistor having an emitter-base junction area greater than the emitter-base junction areas of the other transistors of that current mirror amplifier such that a predetermined current magnification greater than unity is provided by said current mirror source.

25. A circuit according to claim 21, wherein all of said current mirror amplifiers are defined by circuit elements of a common integrated circuit and wherein said resistive means is external to said integrated circuit.

26. A circuit according to claim 16, wherein said first and second input terminals are coupled to input terminals are coupled to input amplifiers in the first and second current replication paths.

27. A circuit according to claim 16, including further resistance means connected between a voltage supply line and said constant current source for supplying a predetermined bias current thereto for determination of the magnitude of said equal input currents.

28. A circuit according to claim 16, wherein said second input terminal and said first output terminal are both connected to a common reference potential and a load impedance is connected to said second output terminal to provide a linear amplifier circuit.

29. A circuit according to claim 16, including capacitor means coupling said second input terminal and said first output terminal to a reference potential, and further resistive means coupling said second output terminal to said reference potential, to provide a differential circuit.

30. A circuit according to claim 16, including first capacitor means coupling said second input terminal and said first output terminal to a reference potential, and second capacitor means coupling said second output terminal to said reference potential, the capacity of said first capacitor being greater than the capacity for generating an integration output signal at said second output terminal and a signal representing an integration constant at said first output terminal.

* * * * *